United States Patent
Minami (10) Patent No.: US 9,295,149 B2
(45) Date of Patent: Mar. 22, 2016

(54) PRINTED CIRCUIT BOARD, MANUFACTURING METHOD THEREFOR, AND METAL-SURFACE TREATMENT LIQUID

(71) Applicant: FUJIFILM Corporation, Minato-ku, Tokyo (JP)

(72) Inventor: Koichi Minami, Ashigara-kami-gun (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

(21) Appl. No.: 14/039,803

(22) Filed: Sep. 27, 2013

(65) Prior Publication Data

US 2014/0020932 A1 Jan. 23, 2014

Related U.S. Application Data (63) Continuation of application No. PCT/JP2012/056904, filed on Mar. 16, 2012.

(30) Foreign Application Priority Data

Mar. 30, 2011 (JP) .................................. 2011-076049
Aug. 12, 2011 (JP) .................................. 2011-176961

(51) Int. Cl.
*H05K 3/44* (2006.01)
*H05K 1/02* (2006.01)
*H05K 3/38* (2006.01)
(Continued)

(52) U.S. Cl.
CPC .............. *H05K 1/0237* (2013.01); *H05K 3/389* (2013.01); *H05K 3/44* (2013.01); *H05K 3/4673* (2013.01); *H05K 2203/122* (2013.01)

(58) Field of Classification Search
USPC ............. 361/746, 728; 29/846; 174/258, 251; 422/82.05, 164; 436/518; 427/376.6; 428/343

See application file for complete search history.

(56) References Cited

U.S. PATENT DOCUMENTS

| 4,598,009 | A | * | 7/1986 | Christie et al. ................ 428/172 |
| 5,487,792 | A | * | 1/1996 | King et al. .................... 136/256 |
| 6,858,527 | B2 | * | 2/2005 | Gracias ......................... 438/628 |

(Continued)

FOREIGN PATENT DOCUMENTS

| JP | 2000-156563 A | 6/2000 |
| JP | 2000196207 A | 7/2000 |

(Continued)

OTHER PUBLICATIONS

Notification of Reasons for Refusal, dated Sep. 24, 2014, issued in related JP Application No. 2012-060145, 4 pages in English and Japanese.

(Continued)

*Primary Examiner* — Timothy Thompson
*Assistant Examiner* — Michael F McAllister
(74) *Attorney, Agent, or Firm* — Sughrue Mion, PLLC (57) ABSTRACT

The purpose of the present invention is to provide a printed circuit board wherein a resin layer exhibits excellent adhesion and a method for manufacturing said printed circuit board. This printed circuit board is provided with an insulating substrate, metal wiring laid out on said insulating substrate, and an insulating layer disposed on top of said metal wiring. A layer consisting of a thiol compound having at least four functional groups represented by formula (1) is interposed between the metal wiring and the insulating layer at the interface therebetween.

10 Claims, 1 Drawing Sheet

(51) Int. Cl.
  *H05K 3/46* (2006.01)
  *H01L 31/04* (2014.01)

(56) References Cited

U.S. PATENT DOCUMENTS

| | | | |
|---|---|---|---|
| 7,661,190 B2 * | 2/2010 | Wakisaka | 29/846 |
| 2003/0124259 A1 * | 7/2003 | Kodas et al. | 427/376.6 |
| 2004/0170770 A1 * | 9/2004 | Nguyen et al. | 427/407.1 |
| 2004/0237295 A1 * | 12/2004 | Wakizaka et al. | 29/830 |
| 2005/0175850 A1 * | 8/2005 | Koyano et al. | 428/458 |
| 2006/0003568 A1 * | 1/2006 | Choi et al. | 438/610 |
| 2007/0269665 A1 * | 11/2007 | Shimoohsako et al. | 428/458 |
| 2008/0032109 A1 * | 2/2008 | Leising et al. | 428/220 |
| 2009/0016933 A1 * | 1/2009 | Minami et al. | 422/82.05 |
| 2009/0121192 A1 * | 5/2009 | Abys et al. | 252/392 |
| 2009/0218310 A1 * | 9/2009 | Zu et al. | 216/11 |
| 2010/0307805 A1 * | 12/2010 | Nakazawa et al. | 174/259 |
| 2011/0226733 A1 * | 9/2011 | Zu et al. | 216/37 |
| 2012/0165498 A1 | 6/2012 | Kitano et al. | |

FOREIGN PATENT DOCUMENTS

| | | |
|---|---|---|
| JP | 2001-160689 A | 6/2001 |
| JP | 2001-203462 A | 7/2001 |
| JP | 2004-277444 A | 10/2004 |
| JP | 2009-51936 A | 3/2009 |
| JP | 2009167251 * | 7/2009 |
| JP | 2010-126572 A | 6/2010 |
| WO | 2011/021363 A1 | 2/2011 |

OTHER PUBLICATIONS

International Search Report for PCT/JP2012/056904 dated Jun. 12, 2012.

International Preliminary Report on Patentability and Written Opinion, mailed Oct. 24, 2013, issued in corresponding International Application No. PCT/JP2012/056904, 5 pages in English.

Office Action issued Jul. 16, 2015 in corresponding Korean Patent Application No. 10-2013-7025481.

Office Action dated Nov. 2, 2015 from the Taiwan Intellectual Property Office in counterpart Taiwanese Application No. 101109779.

Office Action dated Nov. 2, 2015 from the State Intellectual Property Office of the People's Republic of China in counterpart Chinese Application No. 201280015917.8.

* cited by examiner

PRINTED CIRCUIT BOARD, MANUFACTURING METHOD THEREFOR, AND METAL-SURFACE TREATMENT LIQUID

BACKGROUND OF THE INVENTION

The present invention relates to a printed circuit board, a manufacturing method therefor, and a metal-surface treatment liquid.

In recent years, as electronic devices have been required to have high functionality and the like, electronic parts have been becoming more integrated with a high density, and printed circuit boards and the like used for the electronic parts have also been becoming more miniaturized and higher in density. Under these circumstances, the width of metal wiring in the printed circuit boards is becoming narrower.

Generally, a printed circuit board is obtained by laminating one or more layers of metal wiring and one or more insulating layers. At this time, if adhesiveness between the metal wiring and the insulating layer is insufficient, a gap is formed between the metal wiring and the insulating layer. When water vapor or the like comes into the gap, electrical insulating properties deteriorate, or a short circuit or the like is caused between wirings.

In the related art, as a technique for improving adhesiveness between the metal wiring and the insulating layer, a technique of roughening the surface of the metal wiring to bring about an anchor effect is used. However, under the current circumstances in which the width of metal wiring is being increasingly narrowed, there are problems that roughening of the surface of the metal wiring is not easy, and high-frequency characteristics become poor due to the formed concavities and convexities.

Accordingly, as a technique for improving adhesiveness between metal wiring and an insulating layer without roughening the surface of the metal wiring, a method of treating the surface of the metal wiring with a triazine thiol derivative has been proposed (JP 2000-156563 A).

SUMMARY OF THE INVENTION

The present inventor conducted examination regarding the adhesiveness of an insulating layer by using the triazine thiol compound (thiocyanuric acid) which is described specificaly in JP 2000-156563 A. As a result, it was found that the adhesiveness does not reach the level required currently and needs to be further improved.

An object of the present invention is to provide a printed circuit board excellent in adhesiveness of an insulating layer and a manufacturing method for such a printed circuit board, in consideration of the current circumstances described above.

Moreover, another abject of the present invention is to provide a metal-surface treatment liquid for a printed circuit board that is used in the above manufacturing method for treating the surface of metal wiring.

As a result of thorough examination, the present inventor found that the above problems can be solved by the following constitutions.

(1) A printed circuit board comprising an insulating substrate, a metal wiring disposed on the insulating substrate, and an insulating layer disposed on the metal wiring,
wherein a layer of a thiol compound having four or more functional groups represented by Formula (1) described later is disposed in an interface between the metal wiring and the insulating layer.

(2) The printed circuit board according to (1), wherein a thiol equivalent (g/eq) of the thiol compound is 2,100 or less.

(3) The printed circuit board according to (1) or (2), wherein a molecular weight of the thiol compound is 8,400 or less.

(4) The printed circuit board according to any one of (1) to (3), wherein the thiol compound is a thiol compound represented by Formula (3) described later.

(5) A manufacturing method of a printed circuit board comprising:
a wiring treatment step in which a core substrate which has an insulating substrate and a metal wiring disposed on the insulating substrate is brought into contact with a metal-surface treatment liquid which contains a thiol compound having four or more functional groups represented by Formula (1) and the core substrate is then washed with a solvent to form a layer of the thiol compound having four or more functional groups represented by Formula (1) on a surface of the metal wiring; and
an insulating layer forming step in which, after the wiring treatment step, an insulating layer is formed on the treated core substrate.

(6) The manufacturing method of a printed circuit board according to (5), wherein a thiol equivalent (g/eq) of the thiol compound is 2,100 or less.

(7) The manufacturing method of a printed circuit board according to (5) or (6), wherein a molecular weight of the thiol compound is 8,400 or less.

(8) The manufacturing method of a printed circuit board according to any one of (5) to (7), wherein the thiol compound is a thiol compound represented by Formula (3) described later.

(9) A metal-surface treatment liquid for a printed circuit board that contains a thiol compound having four or more functional groups represented by Formula (1) described later and is used for treating a surface of a metal wiring of the printed circuit board so as to improve adhesiveness between the metal wiring and an insulating layer in the printed circuit board.

(10) An IC package substrate, comprising the printed circuit board according to any one of (1) to (4).

According to the present invention, a printed circuit board excellent in adhesiveness of an insulating layer and a manufacturing method for such a printed circuit board can be provided.

Moreover, according to the present invention, a metal-surface treatment liquid for a printed circuit board that is used in the above manufacturing method for treating the surface of metal wiring can be provided.

DETAILED DESCRIPTION OF THE INVENTION

Hereinafter, preferable embodiments of the printed circuit board, the manufacturing method therefor, and the metal-surface treatment liquid of the present invention will be described.

First, the features of the present invention will be described in detail by comparison with the conventional technique.

A feature of the present invention exists in that a layer of a thiol compound containing four or more functional groups represented by Formula (1) described later is interposed between metal wiring and an insulating layer. (Hereinafter, a thiol compound containing four or more functional groups represented by Formula (1) is also referred to simply as "thiol compound," and a functional group represented by Formula (1) is also referred to appropriately as "functional group A"). That is, the layer of the compound plays a role of assistant for complementing adhesiveness (role of an adhesion assistance layer) between the metal wiring and the insulating layer. The compound is bonded to the metal wiring via the functional group A and improves the affinity for the insulating layer. Particularly, when the insulating layer contains an epoxy resin having an epoxy group or a (meth)acrylate resin having a (meth)acrylate group, these are excellently reactive with the compound, and accordingly, the adhesiveness between the metal wiring and the insulating layer becomes better.

Moreover, a feature of the manufacturing method of the present invention exists in that after the metal-surface treatment liquid containing a thiol compound is brought into contact with the core substrate having metal wiring, the substrate is further washed with a solvent (washing solvent). The present inventor found that if the unreacted thiol compound that has been physically adsorbed onto an insulating substrate remains, adhesiveness between the insulating layer that is provided onto the core substrate and the insulating substrate becomes defective, and this causes a short circuit. As a result of examination performed based on the above knowledge, it was found that by conducting the treatment as described in the present invention, the thiol compound on the insulating substrate can be removed, and the adhesiveness between the metal wiring and the insulating layer can also be secured.

First, the manufacturing method for a printed circuit board of the present invention will be described in detail, and then preferable embodiments of the manufactured printed circuit board will be described in detail.

The manufacturing method for a printed circuit board of the present invention preferably includes a wiring treatment step, a drying step, and an insulating layer forming step. Moreover, the drying step is an optional step and is performed if necessary.

Hereinafter, with reference to drawings, the materials used in the respective steps and the process of the steps will be described in detail.

[Wiring Treatment Step]

In the wiring treatment step, first, a core substrate (insulating substrate equipped with metal wiring), which includes an insulating substrate and metal wiring disposed on the insulating substrate, is brought into contact with a metal-surface treatment liquid containing a thiol compound having four or more functional groups represented by Formula (1) described later (contact step). Thereafter, the obtained core substrate is washed with a solvent (washing solvent) (washing step). More specifically, the contact step is a step of bringing the core substrate into contact with the metal-surface treatment liquid to cover the surface of the insulating substrate and the surface of the metal wiring of the core substrate with the thiol compound. The washing step is a step of washing the core substrate with a solvent to remove the thiol compound on the surface of the insulating substrate. By these steps, the thiol compound is bonded to the surface of the metal wiring so as to cover the surface, and the adhesiveness between the insulating layer and the core substrate described later is improved.

First, the materials (the core substrate, metal-surface treatment liquid, washing solvent, and the like) used in the wiring treatment step will be described, and then the process of this step will be described.

(Core Substrate)

Figure 1A:
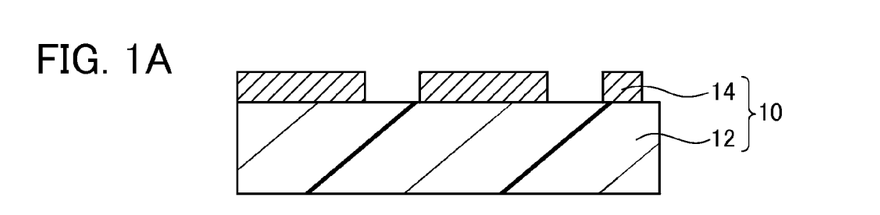
FIG. 1A to 1D show successive steps of the manufacturing method of a printed circuit board according to the present invention with schematic cross-sectional views of a substrate to a printed circuit board.

The core substrate (inner layer substrate) used in this step may be any core substrate having an insulating substrate and a metal wiring disposed on the insulating substrate, with the metal wiring being disposed outermost. In other words, the core substrate is a laminate structure having at least an insulating substrate and a metal wiring, and the metal wiring is disposed outermost. FIG. 1A shows an embodiment of the core substrate, and a core substrate 10 has an insulating substrate 12 and a metal wiring 14 disposed on the insulating substrate 12. In FIG. 1A, the metal wiring 14 is provided on one side of the substrate, but it may be provided on both sides thereof. That is, the core substrate 10 may be either a single-sided substrate or a double-sided substrate.

The insulating substrate is not particularly limited as long as it can support the metal wiring. For example, an organic substrate, a ceramic substrate, a silicon substrate, a glass substrate, and the like can be used.

Examples of the material of the organic substrate include resins, and for example, it is preferable to use a thermosetting resin, a thermoplastic resin, or a resin as a mixture of these. Examples of the thermosetting resin include phenol resins, urea resins, melamine resins, alkyd resins, acrylic resins, unsaturated polyester resins, diallyl phthalate resins, epoxy resins, silicone resins, furan resins, ketone resins, xylene resins, benzocyclobutene resins, and the like. Examples of the thermoplastic resin include polyimide resins, polyphenylene oxide resins, polyphenylene sulfide resins, aramid resins, liquid crystalline polymers, and the like.

In addition, as the material of the organic substrate, glass woven fabric, glass non-woven fabric, aramid woven fabric, aramid non-woven fabric, aromatic polyamide woven fabric, and such fabrics impregnated with the above resins can be used.

The metal wiring is mainly formed of metal. The type of the metal is not particularly limited, and examples thereof include copper or a copper alloy, silver or a silver alloy, tin, palladium, gold, nickel, chromium, platinum, iron, gallium, indium, a combination of these, and the like.

The method for forming the metal wiring on the insulating substrate is not particularly limited, and known methods can be used. Typical examples thereof include a subtractive process using etching treatment, a semiadditive process using electrolytic plating, and the like.

In addition, the metal wiring may contain an organic substance such as a binder resin, within a range that does not diminish the effects of the present invention.

The width of the metal wiring is not particularly limited. However, in view of a high level of integration of the printed circuit board, the width is preferably 0.5 µm to 1,000 µm, more preferably 0.5 µm to 25 and even more preferably 0.5 µm to 10 µm.

The line spacing of the metal wiring is not particularly limited. However, in view of a high level of integration of the printed circuit board, the line spacing is preferably 0.5 µm to 1,000 µm, more preferably 0.5 µm to 25 µm, and even more preferably 0.5 µm to 10 µm.

Moreover, the metal wiring is not particularly limited in pattern shape but may be of any pattern. Exemplary patterns include a linear pattern, a curved pattern, a rectangular pattern, and a circular pattern.

The thickness of the metal wiring is not particularly limited. However, in view of a high level of integration of the printed circuit board, the thickness is preferably 1 µm to 1,000 µm, more preferably 3 µm to 25 µm, and even more preferably 10 µm to 20 µm.

In the present invention, the adhesiveness of the insulating layer described later can be secured without performing roughening treatment on the surface of the metal wiring. Accordingly, the surface roughness Rz of the metal wiring is not particularly limited. However, in view of high-frequency characteristics and the like of the obtained printed circuit board, the Rz is preferably 10 µm or less, more preferably 0.001 µm to 2 µm, and even more preferably 0.01 µm to 0.9 µm, especially 0.02 µm to 0.5 µm.

Here, the Rz is measured according to JIS B 0601 (1994).

As another embodiment of the core substrate used in this step, a multi-layered circuit board which alternately includes two or more insulating substrates and two or more metal wirings is mentioned. For example, between the insulating substrate 12 and the metal wiring 14, another metal wiring 50 (metal wiring layer) and another insulating substrate 40 may be disposed in this order (see FIG. 2). In addition, two or more other metal wirings 50 and two or more other insulating layers 40 may be alternately disposed in this order between the substrate 12 and the metal wiring 14.

Figure 2:
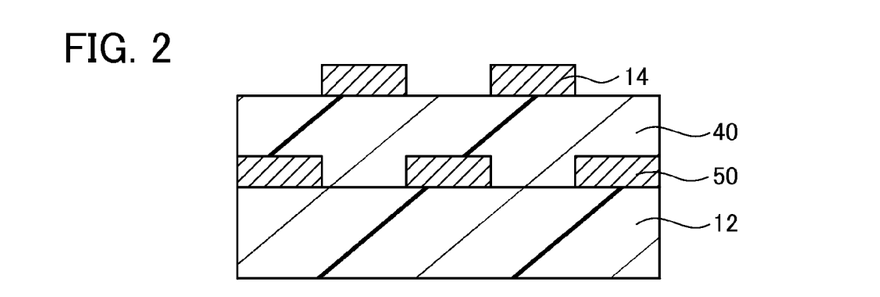
FIG. 2 is a schematic cross-sectional view showing another embodiment of a core substrate.

Moreover, the core substrate 10 may be a so-called rigid substrate, flexible substrate, or rigid flexible substrate.

In addition, in the insulating substrate, a through hole may be formed. When the metal wiring is provided on both sides of the insulating substrate, metal (for example, copper or a copper alloy) is filled in the through hole, whereby the metal wirings on both sides may be connected to each other.

(Metal-Surface Treatment Liquid)

The metal-surface treatment liquid used in this step contains a thiol compound having four or more functional groups represented by Formula (1) (hereinafter also referred to appropriately as "functional groups A"). In Formula (1), an asterisk symbol "*" represents a binding site.

[Chemical Formula 1]

Formula (1)

The treatment liquid is used for improving the adhesiveness between the metal wiring and the insulating layer described later in the printed circuit board, and is a treatment liquid for treating the surface of the metal wiring. That is, it is a treatment liquid for improving adhesiveness between the metal wiring and the insulating layer by imparting a thiol compound to the metal wiring.

Hereinafter, the thiol compound will be described in detail first, and then optional components (solvent and the like) will be described in detail.

(Thiol Compound)

The thiol compound contains four or more functional groups A. The adhesiveness between the metal wiring in the core substrate and the insulating layer is improved by the fact that the functional groups A as contained in the compound are four or more in number. The upper limit of the number of the functional groups A is not particularly limited. However, in view of the restriction on the synthesis of the compound, the upper limit is preferably 200 or less. Particularly, in view of better adhesiveness of the insulating layer, the number of the functional groups A is preferably 4 to 20, more preferably 4 to 10, and even more preferably 4 to 6.

When the number of the functional groups A is 3 or less, the adhesiveness of the insulating layer becomes extremely poor.

In addition, since the thiol compound in the present invention contains a functional group represented by Formula (1) (so-called primary thiol group), in which an HS group is bonded to a methylene group, a desired effect is obtained.

On the other hand, in the case of a so-called secondary thiol group such as —C(CH$_3$)H—SH, a disulfide group such as —S—SH, or a group in which an HS group is bonded to a triazine ring or a benzene ring, the activity of the HS group is reduced. Accordingly, when a compound containing such a group is used, the adhesiveness of the insulating layer becomes extremely poor.

The thiol equivalent (g/eq) of the thiol compound is not particularly limited. However, in view of better adhesiveness of the insulating layer, it is preferably 2,100 or less, more preferably 400 or less, and even more preferably 250 or less. Moreover, the lower limit thereof is not particularly limited. However, in view of synthesis of the compound having an HS group (with a molecular weight of 33), the lower limit is greater than 33 in general.

Here, the thiol equivalent refers to the molecular size per unit quantity of mercapto groups (HS groups) contained in the thiol compound.

The molecular weight of the thiol compound is not particularly limited. However, in view of better adhesiveness of the insulating layer and excellent solubility in a solvent or the like, it is preferably 8,400 or less, more preferably 3,000 or less, and particularly preferably 2,000 or less. Moreover, the lower limit thereof is not particularly limited. However, in view of the synthesis of the thiol compound, the lower limit is generally 200 or greater.

The content of sulfur atoms (proportion of sulfur atoms contained) in the thiol compound is not particularly limited. However, in view of better adhesiveness of the insulating layer, it is preferably 20% by weight or more and more preferably 24% by weight to 70% by weight. Especially, in view of particularly excellent adhesiveness of the insulating layer, the content is preferably 35% by weight or more, and more preferably 35% by weight to 64% by weight.

Here, the content of sulfur atoms refers to the content (% by weight) of sulfur atoms in a total molecular weight of the thiol compound.

The thiol compound may contain silicon atoms, and the weight ratio of the content of silicon atoms to the content of HS groups (content of silicon atoms/content of HS groups) is preferably 0.7 or less, more preferably 0.44 or less, and even more preferably 0.22 or less. Moreover, the lower limit thereof is not particularly limited and may be 0. Within the above range, the adhesiveness of the insulating layer becomes better.

Here, the content of HS groups refers to the content (% by weight) of HS groups in a total molecular weight of the thiol compound, and the content of silicon atoms refers to the content (% by weight) of silicon atoms in a total molecular weight of the thiol compound.

When the thiol compound contains silicon atoms, the weight ratio of the content of silicon atoms to the content of sulfur atoms (content of silicon atoms/content of sulfur atoms) is preferably 0.35 or less, more preferably 0.18 or less, and even more preferably 0.09 or less. Moreover, the lower limit thereof is not particularly limited and may be 0. Within the above range, the adhesiveness of the insulating layer becomes better.

As a preferable embodiment of the thiol compound, a thiol compound represented by the following Formula (2) is mentioned. According to this embodiment, the adhesiveness of the insulating layer becomes better.

[Chemical Formula 2]

Formula (2)

In Formula (2), L$^1$ represents a single bond or a divalent linking group. Examples of the divalent linking group include a divalent aliphatic hydrocarbon group (preferably having 1 to 8 carbon atoms), a divalent aromatic hydrocarbon group (preferably having 6 to 12 carbon atoms), —O—, —S—, —SO$_2$—, —N(R)— (R: an alkyl group), —CO—, —NH—, —COO—, —CONH—, a group as a combination of these (for example, an alkyleneoxy group, an alkyleneoxycarbonyl group, or an alkylenecarbonyloxy group), and the like.

Examples of the divalent aliphatic hydrocarbon group (for example, an alkylene group) include a methylene group, an ethylene group, a propylene group, a butylene group, and the like.

Examples of the divalent aromatic hydrocarbon group include a phenylene group, a naphthylene group, and the like.

In Formula (2), X represents an n-valent hydrocarbon group which may contain a sulfur atom or an oxygen atom.

The number of carbon atoms of the hydrocarbon group is not particularly limited. However, in view of handleability, solubility in a solvent, and the like, the number of carbon atoms is preferably 1 to 20, and more preferably 1 to 8. More specific examples of the hydrocarbon group include an aliphatic hydrocarbon group, an aromatic hydrocarbon group, and a group as a combination of these.

The aliphatic hydrocarbon group is not particularly limited. However, in view of excellent handleability and better adhesiveness of the insulating layer, the aliphatic hydrocarbon group preferably has 1 to 10 carbon atoms and more preferably has 1 to 8 carbon atoms.

The aromatic hydrocarbon group is not particularly limited. However, in view of excellent handleability and better adhesiveness of the insulating layer, the aromatic hydrocarbon group preferably has 1 to 10 carbon atoms and more preferably has 1 to 7 carbon atoms.

In Formula (2), n represents an integer of 4 or greater. In view of easiness of synthesis and better adhesiveness of the insulating layer, n is preferably 4 to 20 and more preferably 4 to 6.

As a preferable embodiment of the thiol compound represented by Formula (2), a thiol compound represented by Formula (3) is mentioned. According to this embodiment, the adhesiveness of the insulating layer becomes better.

[Chemical Formula 3]

Formula (3)

In Formula (3), $L^2$ represents a divalent aliphatic hydrocarbon group which may contain —COO—, —S—, or —O—. A preferable range of the number of carbon atoms of the aliphatic hydrocarbon group is the same as that of the aliphatic hydrocarbon group represented by $L^1$. Particularly, in the respect that the effects of the present invention become better, $L^2$ is preferably an aliphatic hydrocarbon group containing —COO—, —S—, or —O—, and more preferably an aliphatic hydrocarbon group containing —S—.

In Formula (3), Y represents an n-valent aliphatic hydrocarbon group which may contain a sulfur atom or an oxygen atom. A preferable range of the number of carbon atoms of the aliphatic hydrocarbon group is the same as that of the aliphatic hydrocarbon group represented by X.

Moreover, as a preferable embodiment of Y, a group represented by the following Formula (4) or (5) is mentioned.

[Chemical Formula 4]

Formula (4)

Formula (5)

In Formula (5), $L^3$ represents a divalent aliphatic hydrocarbon group (preferably having 1 to 20 carbon atoms and more preferably having 1 to 10 carbon atoms; the number of carbon atoms means a total number of carbon atoms contained in this group) containing an sulfur atom or an oxygen atom.

In Formulae (4) and (5), an asterisk symbol "*" represents a binding site with an $L^2$ group.

One kind of the thiol compound may be used alone, or two or more kinds thereof may be used concurrently.

Specific examples of the thiol compound preferably include pentaerythritol tetrakis(3-mercaptopropionate), dipentaerythritol hexakis (3-mercaptopropionate), tetrakis-(7-mercapto-2,5-dithiaheptyl)methane, the following compound A, and the like. In view of better adhesiveness of the insulating layer, tetrakis-(7-mercapto-2,5-dithiaheptyl)methane and the compound A are particularly preferable.

[Chemical Formula 5]

Compound A

The content of the thiol compound in the metal-surface treatment liquid is not particularly limited. However, in view of better adhesiveness of the insulating layer, it is preferably 0.01 mM (millimole) to 10 mM, more preferably 0.05 mM to 3 mM, and even more preferably 0.1 mM to 1 mM. If the content of the thiol compound is too large, it is difficult to control the amount of the thiol compound bonded to the metal wiring, and economic efficiency becomes poor. If the content of the thiol compound is too small, it takes time for the thiol compound to be bonded, and productivity becomes poor.

The treatment liquid may contain a solvent (particularly, a solvent that dissolves the thiol compound). The solvent to be used is not particularly limited, and examples thereof include water, alcohol-based solvents (for example, methanol, ethanol, and isopropanol), ketone-based solvents (for example, acetone, methyl ethyl ketone, and cyclohexanone), amide-based solvents (for example, formamide, dimethylacetamide, N-methylpyrrolidone, and N-ethylpyrrolidone), nitrile-based solvents (for example, acetonitrile and propionitrile), ester-based solvents (for example, methyl acetate, ethyl acetate, and γ-butyrolactone), carbonate-based solvents (for example, dimethyl carbonate and diethyl carbonate), ether-based solvents (for example, cellosolve and tetrahydrofuran), halogen-based solvents, glycol ether-based solvents (for example, dipropylene glycol methyl ether), glycol ester-based solvents (for example, propylene glycol monomethyl ether acetate and diethylene glycol monoethyl ether acetate), and the like. Two or more kinds of these solvents may be used as a mixture.

Among these, in view of solubility of the thiol compound, ketone-based solvents, glycol ester-based solvents, and alcohol-based solvents are preferable.

In addition, depending on the combination of the solvent and the thiol compound, the metal wiring partially dissolves, so the use of some combinations is not favorable. For example, when water is used as a solvent in the treatment liquid, and this treatment liquid is used for copper wiring, the copper wiring partially dissolves depending on the condition of use (temperature, time, and the like). Moreover, sometimes the thiol compound and a metal complex form a copper coating film in the shape of a layer. Therefore, the adhesion force of the insulating layer deteriorates in some cases, which is not favorable.

Further, nitrogen bubbling can be appropriately performed in the treatment liquid so as to inhibit formation of an oxide film on the metal surface.

The content of the solvent in the treatment liquid is not particularly limited. However, it is preferably 90% by weight to 99.99% by weight, more preferably 95% by weight to 99.99% by weight, particularly 97% by weight to 99.99% by weight, of the total amount of the treatment liquid.

It is preferable that the treatment liquid practically not contain a resin having a functional group reacting with the thiol compound (hereinafter also referred to as "resin X"; such a resin being exemplified by an epoxy resin or an acrylic resin having an acrylate group). If the treatment liquid contains the resin X, the resin reacts with the thiol compound, whereby stability of the treatment liquid itself is impaired. Moreover, it is difficult to bind the thiol compound in a desired amount onto the metal wiring, and accordingly, the adhesiveness of the insulating layer deteriorates.

Here, the state where the treatment liquid practically does not contain the resin X means that the content of the resin X in the treatment liquid is 1% by weight or less of the total amount of the treatment liquid. It is particularly preferable that the treatment liquid contain no resin X (0% by weight of any resin X).

The treatment liquid may also contain additives such as a pH regulator, a surfactant, a preservative, and a precipitation inhibitor.

(Washing Solvent)

The solvent (washing solvent) used in the washing step for washing the core substrate is not particularly limited, as long as it can remove the surplus thiol compound deposited between the metal wirings on the insulating substrate, or the like. Among others, a solvent that dissolves the thiol compound is preferred. If such a solvent is used, the surplus thiol compound deposited onto the insulating substrate, the surplus thiol compound on the metal wiring, or the like can be more efficiently removed.

Examples of the solvent include water, alcohol-based solvents (for example, methanol, ethanol, and propanol), ketone-based solvents (for example, acetone, methyl ethyl ketone, and cyclohexanone), amide-based solvents (for example, formamide, dimethylacetamide, N-methylpyrrolidone, and N-ethylpyrrolidone), nitrile-based solvents (for example, acetonitrile and propionitrile), ester-based solvents (for example, methyl acetate, ethyl acetate, and γ-butyrolactone), carbonate-based solvents (for example, dimethyl carbonate and diethyl carbonate), ether-based solvents (for example, cellosolve and tetrahydrofuran), halogen-based solvents, glycol ether-based solvents (for example, dipropylene glycol methyl ether), glycol ester-based solvents (for example, propylene glycol monomethyl ether acetate and diethylene glycol monoethyl ether acetate), and the like. Two or more kinds of these solvents may be used as a mixture.

Among these, in view of removability of the thiol compound, alcohol-based solvents, ketone-based solvents (preferably cyclohexanone), glycol ester-based solvents (preferably propylene glycol monomethyl ether acetate and diethylene glycol monoethyl ether acetate), amide-based solvents (preferably N-ethylpyrrolidone), and solvents as a mixture of these solvents and water are preferable.

The boiling point (at 25° C. and one atmosphere) of the solvent to be used is not particularly limited. However, in view of safety, it is preferably 75° C. to 200° C. and more preferably 80° C. to 180° C.

[Process of Wiring Treatment Step]

The wiring treatment step will be described by dividing it into the following two steps.

(Contact step): A step of bringing the core substrate into contact with the metal-surface treatment liquid containing the thiol compound.

(Washing step): A step of washing the resultant core substrate with a solvent (washing solvent).

(Contact Step)

Figure 1B:
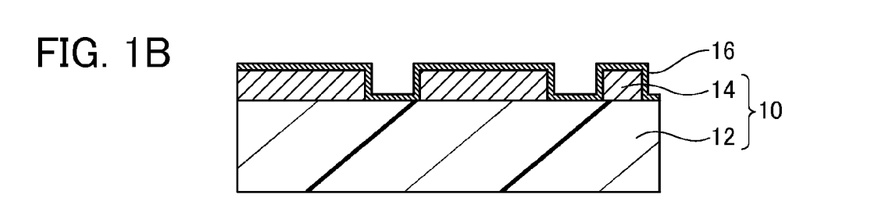

If the core substrate (particularly, the surface of the core substrate on the metal wiring side) is brought into contact with the metal-surface treatment liquid, a layer 16 of the thiol compound is formed on the core substrate 10 as shown in FIG. 1B. The layer 16 is formed on the insulating substrate 12 and the metal wiring 14. In other words, the contact step is a step of covering the surface of the insulating substrate 12 and the surface of the metal wiring 14 of the core substrate 10 with a layer of the thiol compound by using the metal-surface treatment liquid. Particularly, the thiol compound on the surface of the metal wiring 14 is bonded to the surface of the metal wiring 14 via a thiol group.

The method of bringing the core substrate into contact with the metal-surface treatment liquid is not particularly limited, and a known method such as a method of applying the metal-surface treatment liquid onto the core substrate can be used. Examples of the method include dipping, shower spraying, spray coating, spin coating, and the like. In view of simplicity of the treatment and easiness of adjusting the treatment time, dipping, shower spraying, and spray coating are preferable.

In addition, the temperature of the treatment liquid at the time of contact is preferably within a range of 5° C. to 75° C., more preferably within a range of 10° C. to 45° C., and even more preferably within a range of 15° C. to 35° C., in view of controlling the deposit amount (bonding amount) of the thiol compound.

Moreover, the contact time is preferably within a range of 30 seconds to 120 minutes, more preferably within a range of 3 minutes to 60 minutes, and even more preferably within a range of 5 minutes to 30 minutes, in view of productivity and of controlling the deposit amount (bonding amount) of the thiol compound.

(Washing Step)

Figure 1C:
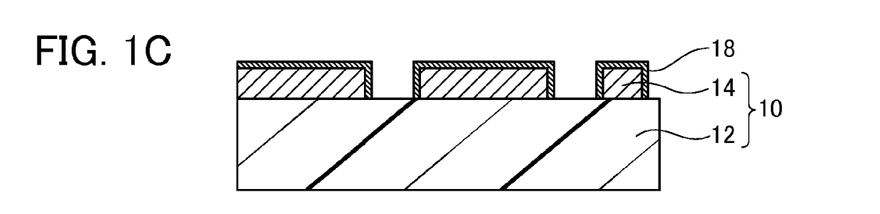

Subsequently, the resultant core substrate is washed with a solvent. If this step is performed, the thiol compound other than the thiol compound having been bonded to the metal wiring, particularly, the thiol compound on the surface of the insulating substrate can be washed away. Particularly, if a solvent that dissolves the thiol compound is used as a solvent, the thiol compound other than the thiol compound having been bonded to the metal wiring (particularly, the thiol compound on the surface of the insulating substrate) is dissolved and removed. If this step is performed, as shown in FIG. 1C, the surplus thiol compound on the metal wiring 14 is removed, the layer 16 of the thiol compound on the insulating substrate 12 is also removed, and a layer 18 of the thiol compound having been bonded to the surface of the metal wiring 14 is obtained. After this step ends, the thiol compound may remain on a portion of the insulating substrate 12, within a range that does not diminish the effects of the present invention.

The washing method is not particularly limited, and a known method can be used. Examples of the method include a method of applying the washing solvent onto the core substrate (particularly, onto its surface on the metal wiring side), a method of dipping the core substrate into the washing solvent, and the like.

The temperature of the washing solvent is preferably within a range of 5° C. to 60° C. and more preferably within a range of 15° C. to 35° C., in view of controlling the deposit amount (bonding amount) of the thiol compound.

In addition, the time of contact between the core substrate and the washing solvent is preferably within a range of 10 seconds to 10 minutes and more preferably within a range of 15 seconds to 5 minutes, in view of productivity and of controlling the deposit amount (bonding amount) of the thiol compound.

(Thiol Compound Layer)

The thickness of the layer of the thiol compound having been bonded to the surface of the metal wiring, which layer is obtained by way of the washing step, is not particularly limited. However, in view of better adhesiveness of the insulating layer, it is preferably 0.1 nm to 10 nm, more preferably 0.1 nm to 3 nm, and even more preferably 0.1 nm to 2 nm. If the thickness of the thiol compound layer is too large, the adhesiveness of the insulating layer becomes poor, and if it is too small, the effect of adhering to the insulating layer is diminished.

In addition, in order to control the thickness or coverage rate of the thiol compound layer, the wiring treatment step may be performed two or more times consecutively. In that case, the thiol compound used in the first wiring treatment step and the thiol compound used in the second wiring treatment step may be different from each other. The solvent in the treatment liquid may be different between the first and second wiring treatment steps. For example, depending on the species of the thiol compound, dipping time can be shortened by using propylene glycol monomethyl ether acetate in the first step and cyclohexanone in the second step.

(Preferable Embodiment of Wiring Treatment Step)

As one of the preferable embodiments of the wiring treatment step, an embodiment is mentioned in which after the washing step, a resin contact step is performed to bring the resultant core substrate into contact with a resin composition containing an epoxy resin and then wash the core substrate with a solvent. More specifically, by using the resin composition, a resin composition layer which covers the metal wiring surface covered with the thiol compound and the insulating substrate surface is formed, and then the core substrate is washed with a solvent to remove the resin composition layer on the insulating substrate surface.

If the embodiment is performed, the thiol compound having been bonded onto the metal wiring reacts with the epoxy resin, whereby a migration inhibitory layer containing the thiol compound and the epoxy resin, which inhibits the migration of metal ions more effectively, is formed on the metal wiring, and as a result, reliability of insulation between the wirings is further improved.

The epoxy resin to be used is not particularly limited as long as it has at least one epoxy group, and known resins (for example, glycidyl ether-type epoxy resins, glycidyl ester-type epoxy resins, glycidyl amine-type epoxy resins, and polyglycidyl methacrylate) can be used.

The number average molecular weight of the epoxy resin is not particularly limited. However, in view of better adhesiveness of the insulating layer, it is preferably 7,500 or more, more preferably 17,500 or more, and even more preferably 36,000 or more. In addition, the upper limit thereof is not particularly limited. However, in the respect that the layer can be easily removed at the time of mounting electronic parts, the upper limit is preferably 500,000 or less and more preferably 150,000 or less. Moreover, epoxy resins having different number average molecular weights may be used concurrently.

The content of the epoxy resin in the resin composition is not particularly limited, but it is preferably 10% by weight to 100% by weight and more preferably 50% by weight to 90% by weight of the total amount of the resin composition.

The resin composition may contain a solvent. The type of solvent to be used is not particularly limited, and examples thereof include alcohol-based solvents, ketone-based solvents, amide-based solvents, nitrile-based solvents, ester-based solvents (for example, γ-butyrolactone), carbonate-based solvents, ether-based solvents (for example, tetrahydrofuran), halogen-based solvents, glycol ether-based solvents, glycol ester-based solvents, and the like.

It is preferable that the resin composition practically not contain an inorganic filler. If the epoxy resin layer formed by using the resin composition contains an inorganic filler, the adhesiveness of the insulating layer deteriorates. Examples of the inorganic filler include known materials such as alumina (aluminum oxide), magnesia (magnesium oxide), calcium oxide, titania (titanium oxide), zirconia (zirconium oxide), talc, and silica (silicon oxide).

Here, the state where the resin composition practically does not contain the inorganic filler means that the content of the inorganic filler in the resin composition is 0.9% by weight or less of the total amount of the resin composition. It is particularly preferable that the resin composition contain no inorganic filler (0% by weight of any inorganic filler).

The solvent (washing solvent) used for washing the core substrate is not particularly limited as long as it can remove the resin composition deposited on the insulating substrate. Among others, a solvent that dissolves the epoxy resin is preferred. If such a solvent is used, the surplus epoxy resin deposited on the insulating substrate, the surplus epoxy resin on the metal wiring, or the like can be removed more efficiently.

Examples of the solvent include alcohol-based solvents, ketone-based solvents, amide-based solvents, nitrile-based solvents, ester-based solvents (for example, γ-butyrolactone), carbonate-based solvents, ether-based solvents (for example, tetrahydrofuran), halogen-based solvents, glycol ether-based solvents, glycol ester-based solvents, and the like.

The method of bringing the core substrate into contact with the resin composition containing an epoxy resin that is performed in the resin contact step is not particularly limited, and application of the resin composition onto the core substrate and such other known methods as mentioned in the above contact step are usable.

The contact time is preferably within a range of 30 seconds to 60 minutes, more preferably within a range of 1 minute to 30 minutes, and even more preferably 3 minutes to 20 minutes, in view of productivity and of controlling the deposit amount (bonding amount) of the epoxy resin.

The washing method of the core substrate that is performed in the resin contact step is not particularly limited, and a known method can be used. Examples of the method include a method of applying the washing solvent onto the core substrate, a method of dipping the core substrate into the washing solvent, and the like.

If the resin contact step is performed, a laminate structure composed of the thiol compound layer and the epoxy resin layer is formed on the metal wiring.

The thickness of the epoxy resin layer provided on the thiol compound layer is not particularly limited. However, in the respect that the layer can be easily removed at the time of mounting electronic parts, it is preferably 1 μm or less, more preferably 0.2 μm or less, and even more preferably 0.1 μm or less. Moreover, the lower limit thereof is not particularly limited. However, in the respect that the adhesiveness of the insulating layer is further improved by the epoxy resin layer, the lower limit is preferably 0.005 μm or more.

In addition, it is preferable that the epoxy resin layer practically not contain an inorganic filler. The state where the epoxy resin layer practically does not contain the inorganic filler means that the content of the inorganic filler in the epoxy resin layer is 0.9% by weight or less of the total amount of the epoxy resin layer. It is particularly preferable that the epoxy resin layer contain no inorganic filler (0% by weight of any inorganic filler).

Further, if necessary, the above contact step and washing step, and the above resin contact step may be performed plural times (twice or more) consecutively. For example, an embodiment is mentioned in which after the above contact step and washing step are performed, the resin contact step is performed, and then the contact step and washing step, and the resin contact step are performed again.

In this embodiment, on the metal wiring, the thiol compound layer, the epoxy resin layer, the thiol compound layer, and the epoxy resin layer are disposed in this order.

If the above embodiment is performed, reliability of insulation between lines of the wiring is further improved.

[Drying Step]

In this step, the core substrate having the metal wiring to which the thiol compound has been bonded is heated and dried. If moisture remains on the core substrate, migration of metal ions is accelerated, and as a result, insulating properties between lines of the wiring may deteriorate. Accordingly, it is preferable to remove the moisture by performing this step. In addition, this step is an optional step, and when the solvent used in the wiring treatment step has excellent volatility, this step may not be performed.

In view of inhibiting oxidation of the metal in the metal wiring, it is preferable that drying by heating is performed at 70° C. to 120° C. (preferably 80° C. to 110° C.) for 15 seconds to 10 minutes (preferably 30 seconds to 5 minutes). If the drying temperature is too low, or the drying time is too short, sometimes moisture is not removed sufficiently. If the drying temperature is too high, or the drying time is too long, a metal oxide film may be formed.

The instrument used for drying is not particularly limited, and known heating instruments such as a constant temperature zone and a heater can be used.

[Insulating Layer Forming Step]

Figure 1D:
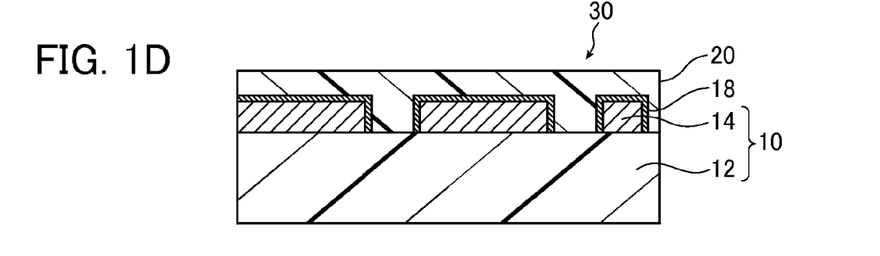

In this step, an insulating layer is formed on the core substrate (its surface on the metal wiring side) having the metal wiring covered with the thiol compound layer. As shown in FIG. 1D, an insulating layer 20 is so provided onto the core substrate 10 as to come into contact with the metal wiring 14 covered with the thiol compound layer 18. Since the insulating layer 20 is provided, reliability of insulation between the metal wiring 14 is secured. Moreover, since the insulating layer 20 comes into direct contact with the insulating substrate 12, the adhesiveness of the insulating layer 20 becomes excellent.

First, the insulating layer to be used will be described, and then the method for forming the insulating layer will be described.

As the insulating layer, known insulating materials can be used. For example, materials used as a so-called interlayer insulating layer can be used, and specific examples thereof include epoxy resins, aramid resins, crystalline polyolefin resins, amorphous polyolefin resins, fluorine-containing resins (polytetrafluoroethylene, perfluorinated polyimide, perfluorinated amorphous resins, and the like), polyimide resins, polyether sulfone resins, polyphenylene sulfide resins, polyether ether ketone resins, acrylate resins, and the like. Examples of the interlayer insulating layer include ABF GX-13 and GX-92 manufactured by Ajinomoto Fine-Techno Co., Inc., and the like.

In addition, as the insulating layer, a so-called solder resist layer may be used. Commercially available solder resists may be used, and specific examples thereof include PFR800 and PSR4000 (trade names) manufactured by TAIYO INK MFG. CO., LTD., SR7200G and SR7300G manufactured by Hitachi Chemical Co., Ltd., and the like.

Moreover, as the insulating layer, a photosensitive film resist may be used. Specific examples thereof include SUN-FORT manufactured by Asahi Kasei E-materials Corp., Photec manufactured by Hitachi Chemical Co., Ltd., and the like.

Among these, a preferred insulating layer contains a resin having an epoxy group or a (meth)acrylate group. Such a resin is easily bonded to the thiol compound layer or the epoxy resin layer described above, and accordingly, the adhesiveness of the insulating layer is further improved.

It is preferable that the above resin be a main component of the insulating layer. The main component means that the total amount of the resin is 50% by weight or more of the total amount of the insulating layer, and the total amount of the resin is preferably 60% by weight or more. The upper limit thereof is 100% by weight.

As the resin having an epoxy group, known epoxy resins can be used. For example, glycidyl ether-type epoxy resins, glycidyl ester-type epoxy resins, glycidyl amine-type epoxy resins, and the like can be used.

As the resin having a (meth)acrylate group, known resins can be used. For example, acrylate resins, methacrylate resins, and the like can be used.

It is preferable that the insulating layer contain an inorganic filler. If the insulating layer contains an inorganic filler, insulating properties are further improved, and the CTE (namely, the linear coefficient of thermal expansion) is reduced. As the inorganic filler, such known materials as mentioned above can be used.

In view of further improving insulating properties, the content of the inorganic filler in the insulating layer is preferably 1% by weight to 85% by weight, more preferably 15% by weight to 80% by weight, and even more preferably 40% by weight to 75% by weight, of the total amount of the insulating layer. Moreover, increase in the content of the inorganic filler has advantages that the oxidation of the metal surface or the oxidation of the thiol compound is inhibited, and thus the adhesiveness becomes excellent.

The method of forming the insulating layer on the core substrate is not particularly limited, and a known method can be used. Examples of the method include a method of directly laminating a film of insulating layer on the core substrate, a method of applying a composition for forming an insulating layer, which contains components constituting the insulating layer, onto the core substrate, a method of dipping the core substrate into the composition for forming an insulating layer, and the like.

In addition, the above composition for forming an insulating layer may contain a solvent if necessary. When the composition for forming an insulating layer that contains a solvent is used, after the composition is provided on the substrate, heating treatment may be performed to remove the solvent if necessary.

Moreover, after the insulating layer is provided on the core substrate, if necessary, energy may be supplied to the insulating layer (for example, by exposure to light or heating treatment).

The thickness of the insulating layer to be formed is not particularly limited. However, in view of reliability of insulation between lines of the wiring, it is preferably 5 μm to 50 μm and more preferably 15 μm to 40 μm.

In FIG. 1D, the insulating layer 20 is illustrated as a single layer. However, it may have a multi-layer structure.

[Printed Circuit Board]

Through the above steps, as shown in FIG. 1D, it is possible to obtain a printed circuit board 30 which includes the core substrate 10, the insulating layer 20 disposed on the surface of the core substrate 10 on the metal wiring 14 side, and the layer 18 of a thiol compound interposed between the metal wiring 14 and the insulating layer 20. In other words, the thiol compound is bonded to the surface of the metal wiring 14 facing the insulating layer 20. The obtained printed circuit board 30 is excellent in the adhesiveness between the insulating layer 20 and the core substrate 10.

In the above, as shown in FIG. 1D, the printed circuit board 30 in which the metal wiring 14 has a single-layered wiring structure is described as an example. However, needless to say, the present invention is not limited thereto. For example, by using a core substrate with multilayer wiring in which another metal wiring (metal wiring layer) and an interlayer insulating layer are laminated in this order between the insulating substrate and the metal wiring, a printed circuit board having a multilayer wiring structure can be manufactured.

Moreover, when the resin contact step is performed in the wiring treatment step, it is possible to obtain a printed circuit board in which the thiol compound layer and the epoxy resin layer are laminated on the surface of the metal wiring.

The printed circuit board obtained by the manufacturing method of the present invention can be used for various purposes and structures, and examples thereof include a substrate for a motherboard, an IC package substrate, an LSI package substrate, a substrate for a semiconductor package, a substrate for a molded interconnect device (MID), and the like. The manufacturing method of the present invention is applicable to a rigid substrate, a flexible substrate, a flexible rigid substrate, a molded circuit board, and the like.

In addition, the insulating layer in the obtained printed circuit board may partially be removed so as to mount semiconductor chips on the board and use the resultant board as a printed circuit assembly.

For example, when a solder resist is used as the insulating layer, a mask having a predetermined pattern shape is disposed on the insulating layer, energy is supplied thereto for curing, and the insulating layer in the area not supplied with energy is removed to expose the wiring. Thereafter, the surface of the exposed wiring is washed by a known method (for example, washing with sulfuric acid, a soft etching agent, an alkali, or a surfactant), and then semiconductor chips are mounted on the surface of wiring.

When a known interlayer insulating layer is used as the insulating layer, the insulating layer can be removed by drill processing or laser processing.

Moreover, on the insulating layer of the obtained printed circuit board, a metal wiring (wiring pattern) may be further provided. The method of forming the metal wiring is not particularly limited, and a known method (plating treatment, sputtering treatment, or the like) can be used.

In the present invention, by using, as a new core substrate (inner layer substrate), the obtained printed circuit board with a metal wiring (wiring pattern) further provided on the insulating layer thereof, multiple insulating layers and metal wirings can be newly laminated.

EXAMPLES

Hereinafter, the present invention will be described in more detail by using examples, but the present invention is not limited thereto.

Example A

Example 1

By using a copper-clad laminate (manufactured by Hitachi Chemical Co., Ltd., MCL-E-679F, substrate: glass epoxy substrate), a core substrate A having copper wiring of L/S=1,000 μm/500 μm was formed by a semiadditive process. The core substrate A was prepared by the following method.

The copper-clad laminate was pickled, washed with water, and dried, and then a dry film resist (DFR, trade name: RY3315, manufactured by Hitachi Chemical Co., Ltd.) was laminated thereon by a vacuum laminator at 70° C. and at a pressure of 0.2 MPa. After lamination, the portion for forming a copper pattern was subjected to mask exposure at 70 mJ/cm$^2$ by using an exposure machine having a center wavelength of 365 nm. Subsequently, the exposed resist was developed using a 1% aqueous sodium bicarbonate solution and washed with water, thereby obtaining a plating resist pattern.

After pre-plating treatment and washing with water, electrolytic plating was performed on copper which is exposed in the resist pattern. At this time, as an electrolytic solution, a sulfuric acid solution of copper (II) sulfate was used, a plate of black copper having a purity of about 99% was used as an anode, and a copper-clad laminate was used as a cathode.

Electrolysis was conducted at 50° C. to 60° C. and 0.2 V to 0.5 V, whereby copper was precipitated on the copper of the cathode. Thereafter, the resultant was washed with water and dried.

In order to peel off the resist pattern, the substrate was dipped in a 4% aqueous NaOH solution at 45° C. for 60 seconds. Subsequently, the resultant substrate was washed with water, dipped in 1% sulfuric acid for 30 seconds, and then washed with water again. By using an etching liquid containing hydrogen peroxide and sulfuric acid as main components, quick etching was performed on the conducting copper in the copper pattern, and then the substrate was washed with water and dried. Further, a roughening treatment agent (MEC etch bond CZ-8100, manufactured by MEC COMPANY LTD.) was used to treat the surface of the copper pattern. The thickness of the copper wiring of the obtained substrate with copper wiring (core substrate A) was 15 μm, and the surface roughness Rz of the copper wiring was 0.8 μm.

Thereafter, the obtained substrate with copper wiring was dipped in a 0.1 mM pentaerythritol tetrakis(2-mercaptoacetate)-containing ethanol solution for 10 minutes. The substrate with copper wiring was then washed with ethanol as a washing solvent, and dried at room temperature. The thiol equivalent (g/eq) of pentaerythritol tetrakis(2-mercaptoacetate) was 108, the molecular weight thereof was 432, and the sulfur atom content thereof was 29% by weight. The "0.1 mM pentaerythritol tetrakis(2-mercaptoacetate)-containing ethanol solution" means that 0.1 mM of contains pentaerythritol tetrakis(2-mercaptoacetate) is contained in the ethanol solution.

Subsequently, an insulating layer (PFR-800 manufactured by TAIYO INK MFG. CO., LTD.) was laminated on the substrate with copper wiring which had been treated with the thiol compound. The layer was then exposed through a pattern mask (L-shaped pattern), developed, baked, and exposed again, thereby preparing a solder resist (SR) pattern on the substrate with copper wiring (thickness of the insulating layer: 30 μm). The obtained SR pattern-formed substrate with copper wiring was subjected to Ni plating as described below, and then a tape peeling test was performed. The insulating layer described above contained an inorganic filler (silica).

(Ni Plating)

The obtained SR pattern-formed substrate with copper wiring was washed with a cleaner liquid (10-fold diluted solution of ACL-007 (trade name) manufactured by C. Uyemura & CO., LTD.) for 5 minutes at 50° C., and further washed by dipping the substrate in a soft etching liquid as a mixture of 10% sulfuric acid (manufactured by Wako Pure Chemical Industries, Ltd.) and sodium peroxodisulfate (manufactured by Wako Pure Chemical Industries, Ltd.) for 1.5 minutes at room temperature. Further, the resultant SR pattern-formed substrate with copper wiring was dipped in 2% sulfuric acid (manufactured by Wako Pure Chemical Industries, Ltd.) for 1 minute and then dipped in an activator liquid as a diluted mixture of 10% sulfuric acid and KAT-450 (manufactured by C. Uyemura & CO., LTD.) for 2 minutes. Thereafter, the SR pattern-formed substrate with copper wiring was further dipped in a Ni plating liquid (liquid temperature: 85° C.) as a diluted mixture of NIMUDEN NDF-2-M (manufactured by C. Uyemura & CO., LTD.) and NIMUDEN NDF-2-A (manufactured by C. Uyemura & CO., LTD.) for 35 minutes, whereby the copper surface was plated with nickel (Ni) (nickel plating thickness: 3 μm).

(Tape Peeling Test)

As a method of evaluation, a tape peeling test was conducted after the above Ni plating, and the number of squares on the substrate with copper wiring that remained without undergoing peeling of the SR pattern was counted. The results regarding the substrate with copper wiring obtained in Example 1 are shown in Table 1.

The tape peeling test was conducted according to JIS K 5600-5-6.

Example 2

An SR pattern-formed substrate with copper wiring was manufactured according to the same process as in Example 1, except that a 1 mM pentaerythritol tetrakis(3-mercaptoacetate)-containing ethanol solution was used instead of the 0.1 mM pentaerythritol tetrakis(2-mercaptoacetate)-containing ethanol solution used in Example 1, and the tape peeling test was conducted. The results are summarized in Table 1.

The thiol equivalent (g/eq) of pentaerythritol tetrakis(3-mercaptoacetate) was 122, the molecular weight thereof was 488, and the sulfur atom content thereof was 26% by weight.

Example 3

An SR pattern-formed substrate with copper wiring was manufactured according to the same process as in Example 1, except that a 0.1 mM dipentaerythritol hexakis(3-mercaptopropionate)-containing cyclohexanone solution was used instead of the 0.1 mM pentaerythritol tetrakis(2-mercaptoacetate)-containing ethanol solution used in Example 1, and that cyclohexanone was used instead of ethanol as a washing solvent, and the tape peeling test was conducted. The results are summarized in Table 1.

The thiol equivalent (g/eq) of dipentaerythritol hexakis(3-mercaptopropionate) was 131, the molecular weight thereof was 783, and the sulfur atom content thereof was 24% by weight.

Example 4

An SR pattern-formed substrate with copper wiring was manufactured according to the same process as in Example 1, except that a 0.1 mM tetrakis-(7-mercapto-2,5-dithiaheptyl)methane-containing cyclohexanone solution was used instead of the 0.1 mM pentaerythritol tetrakis(2-mercaptoacetate)-containing ethanol solution used in Example 1, and that cyclohexanone was used instead of ethanol as a washing solvent, and the tape peeling test was conducted. The results are summarized in Table 1.

The thiol equivalent (g/eq) of tetrakis-(7-mercapto-2,5-dithiaheptyl)methane was 170, the molecular weight thereof was 681, and the sulfur atom content thereof was 56% by weight.

Example 5

An SR pattern-formed substrate with copper wiring was manufactured according to the same process as in Example 1, except that a 0.1 mM compound A-containing cyclohexanone solution was used instead of the 0.1 mM pentaerythritol tetrakis(2-mercaptoacetate)-containing ethanol solution used in Example 1, and that cyclohexanone was used instead of ethanol as a washing solvent, and the tape peeling test was conducted. The results are summarized in Table 1.

The thiol equivalent (g/eq) of the compound A was 222, the molecular weight thereof was 1328, and the sulfur atom content thereof was 56% by weight.

[Chemical Formula 6]

Compound A

Example 6

An SR pattern-formed substrate with copper wiring was manufactured according to the same process as in Example 1, except that instead of the treatment as performed in Example 1, in which the substrate with copper wiring was dipped in a 0.1 mM pentaerythritol tetrakis(2-mercaptoacetate)-containing ethanol solution and washed with ethanol, a treatment, in which the substrate with copper wiring was dipped in a 0.1 mM tetrakis-(7-mercapto-2,5-dithiaheptyl)methane-containing cyclohexanone solution for 10 minutes and washed with a cyclohexanone solution, and then the resultant substrate with copper wiring was dipped in a 5% by weight polyglycidyl methacrylate-containing cyclohexanone solution (number average molecular weight of polyglycidyl methacrylate: 48,000, manufactured by Polymer Source Inc.) for 20 minutes and washed with cyclohexanone, was performed. Moreover, the tape peeling test was conducted. The results are summarized in Table 1.

Example 7

An SR pattern-formed substrate with copper wiring was manufactured according to the same process as in Example 1, except that a cyclohexanone solution containing tetrakis-(7-mercapto-2,5-dithiaheptyl)methane and the compound A was used instead of the 0.1 mM pentaerythritol tetrakis(2-mercaptoacetate)-containing ethanol solution used in Example 1, and that cyclohexanone was used instead of ethanol as a washing solvent, and the tape peeling test was conducted. The results are summarized in Table 1.

The total concentration of tetrakis-7-(mercapto-2,5-dithiaheptyl)methane and the compound A in the cyclohexanone solution was 0.2 mM, with each compound having been contained at a concentration of 0.1 mM.

Example 8

An SR pattern-formed substrate with copper wiring was manufactured according to the same process as in Example 1, except that instead of the treatment as performed in Example 1, in which the substrate with copper wiring was dipped in a 0.1 mM pentaerythritol tetrakis(2-mercaptoacetate)-containing ethanol solution and washed with ethanol, a treatment, in which the substrate with copper wiring was dipped in a tetrakis-(7-mercapto-2,5-dithiaheptyl)methane-containing cyclohexanone solution for 10 minutes and then washed with cyclohexanone, and the resultant substrate with copper wiring was then dipped in a 0.1 mM compound A-containing cyclohexanone solution for 10 minutes and washed with cyclohexanone, was performed. Moreover, the tape peeling test was conducted. The results are summarized in Table 1.

Example 9

An SR pattern-formed substrate with copper wiring was manufactured according to the same process as in Example 1, except that instead of the treatment as performed in Example 1, in which the substrate with copper wiring was dipped in a 0.1 mM pentaerythritol tetrakis(2-mercaptoacetate)-containing ethanol solution and washed with ethanol, the following treatment X was performed, and the tape peeling test was conducted. The results are summarized in Table 1.

(Treatment X)

The substrate with copper wiring was dipped in a 0.1 mM tetrakis-(7-mercapto-2,5-dithiaheptyl)methane-containing cyclohexanone solution for 10 minutes and washed with cyclohexanone. Thereafter, the resultant substrate with copper wiring was dipped in a 5% by weight polyglycidyl methacrylate-containing cyclohexanone solution (number average molecular weight of polyglycidyl methacrylate: 48,000, manufactured by Polymer Source Inc.) for 20 minutes and washed with cyclohexanone. Further, the resultant substrate with copper wiring was dipped in a 100 mM tetrakis-(7-mercapto-2,5-dithiaheptyl)methane-containing cyclohexanone solution for 10 minutes and washed with cyclohexanone. Thereafter, the resultant substrate with copper wiring was dipped in a 5% by weight polyglycidyl methacrylate-containing cyclohexanone solution (number average molecular weight of polyglycidyl methacrylate: 48,000, manufactured by Polymer Source Inc.) for 30 minutes and washed with cyclohexanone.

Comparative Example 1

An SR pattern-formed substrate with copper wiring was manufactured according to the same process as in Example 1, except that instead of the treatment of dipping in the 0.1 mM pentaerythritol tetrakis(2-mercaptoacetate)-containing ethanol solution, which was used in Example 1, for 10 minutes, a treatment of dipping in a 0.1 mM 16-amino-1-hexadecanethiol-containing ethanol solution for 60 minutes was performed, and the tape peeling test was conducted. The results are summarized in Table 1.

The thiol equivalent (g/eq) of 16-amino-1-hexadecanethiol was 274, the molecular weight thereof was 274, and the sulfur atom content thereof was 12% by weight.

Comparative Example 2

An SR pattern-formed substrate with copper wiring was manufactured according to the same process as in Example 1, except that instead of the treatment of dipping in the 0.1 mM pentaerythritol tetrakis(2-mercaptoacetate)-containing ethanol solution, which was used in Example 1, for 10 minutes, a treatment of dipping in a 0.1 mM 1,10-decanedithiol-containing ethanol solution for 60 minutes was performed, and the tape peeling test was conducted. The results are summarized in Table 1.

The thiol equivalent (g/eq) of 1,10-decanedithiol was 103, the molecular weight thereof was 206, and the sulfur atom content thereof was 31% by weight.

Comparative Example 3

An SR pattern-formed substrate with copper wiring was manufactured according to the same process as in Example 1, except that instead of the treatment of dipping in the 0.1 mM pentaerythritol tetrakis(2-mercaptoacetate)-containing ethanol solution, which was used in Example 1, for 10 minutes, a treatment of dipping in a 0.1 mM thiocyanuric acid-containing ethanol solution for 60 minutes was performed, and the tape peeling test was conducted. The results are summarized in Table 1.

The thiol equivalent (g/eq) of thiocyanuric acid was 59, the molecular weight thereof was 177, and the sulfur atom content thereof was 54% by weight.

Comparative Example 4

An SR pattern-formed substrate with copper wiring was manufactured according to the same process as in Example 1, except that instead of the 0.1 mM pentaerythritol tetrakis(2-mercaptoacetate)-containing ethanol solution which was used in Example 1, a 0.1 mM benzenetrithiol-containing ethanol solution was used, and the tape peeling test was conducted. The results are summarized in Table 1.

The thiol equivalent (g/eq) of benzenetrithiol was 58, the molecular weight thereof was 174, and the sulfur atom content thereof was 55% by weight.

Comparative Example 5

An SR pattern-formed substrate with copper wiring was manufactured according to the same process as in Example 1, except that instead of the 0.1 mM pentaerythritol tetrakis(2-mercaptoacetate)-containing ethanol solution which was used in Example 1, a 0.1 mM trimethylolpropane tris(3-mercaptopropionate)-containing ethanol solution was used, and the tape peeling test was conducted. The results are summarized in Table 1.

The thiol equivalent (g/eq) of trimethylolpropane tris(3-mercaptopropionate) was 133, the molecular weight thereof was 398, and the sulfur atom content thereof was 24% by weight.

Comparative Example 6

An SR pattern-formed substrate with copper wiring was manufactured according to the same process as in Example 1, except that instead of the treatment of dipping in the 0.1 mM pentaerythritol tetrakis(2-mercaptoacetate)-containing ethanol solution, which was used in Example 1, for 10 minutes, a treatment of dipping in a 10 mM (3-mercaptopropyl)trimethoxysilane-containing ethanol solution for 5 minutes was performed, and the tape peeling test was conducted. The results are summarized in Table 1.

The thiol equivalent (g/eq) of (3-mercaptopropyl)trimethoxysilane was 196, the molecular weight thereof was 196, and the sulfur atom content thereof was 16% by weight.

Example B

A core substrate B was prepared without performing the surface treatment which was performed for preparing a core substrate in Example 1, on the surface of the copper pattern by using a roughening treatment agent. The thickness of the copper wiring of the obtained substrate with copper wiring (core substrate B) was 15 and the surface roughness Rz of the copper wiring was 0.2 μm.

By using the core substrate B, SR pattern-formed substrates with copper wiring were manufactured according to the same processes as in Examples 4 to 9, respectively, and the tape peeling test was performed for each substrate. The results are summarized in Table 1.

The substrates with copper wiring of Examples 1 to 9 and Comparative Examples 1 to 6 which had been treated with a thiol compound were subjected to X-ray photoelectron spectroscopy (XPS). As a result, it was confirmed that sulfur atoms were present on the copper wiring and the thiol compound was bonded to the copper wiring.

In Examples 1 to 9, the thickness of the thiol compound layer formed on the copper wiring was measured by XPS, and as a result, the thickness was about 0.1 nm to 2 nm in all cases. In addition, in Examples 6 and 9, a laminate structure composed of the thiol compound layer and the epoxy resin layer was formed, and the thickness of the formed epoxy resin layer was about 10 nm to 100 nm.

In the column of "resin contact step" of the following Table 1, "Yes" is marked when the resin contact step was performed, and "-" is marked when the step was not performed.

Moreover, in the column of "core substrate A" of the following Table 1, the results of Example A using the core substrate A are set forth, while the results of Example B using the core substrate B are set forth in the column of "core substrate B". In the columns of "core substrate A" and "core substrate B," "-" means that the tape peeling test was not performed.

Ajinomoto Fine-Techno Co., Inc. was laminated as an insulating layer. Thereafter, by laser processing, a pattern (L-shaped pattern) of the insulating layer (thickness of insulating resin layer: 35 μm) was prepared, and the residue generated due to the laser processing was removed by a desmearing process. Then, Ni plating was performed as described above, and further, the resultant circuit board was dipped in GOBRIGHT TSB-72 (manufactured by C. Uyemura & CO., LTD., liquid temperature: 80° C.) for 5 minutes to perform Au plating treatment (thickness: 30 nm). The insulating layer contained an inorganic filler (silica). Thereafter, the insulating layer-formed substrate with copper wiring was subjected to a thermal cycle test (1,000-time repetition of a testing cycle at −65° C. for 30 minutes, then at 150° C. for 30 minutes), and the tape peeling test was conducted. The results are summarized in Table 2.

TABLE 1

| | | Properties of thiol compound | | | | Number of remaining squares/total number of squares | |
|---|---|---|---|---|---|---|---|
| Example No. | Type of thiol compound | Thiol equivalent (g/eq) | Molecular weight | Sulfur atom content (wt %) | Resin contact step | Core substrate A | Core substrate B |
| Example 1 | Pentaerythritol tetrakis(2-mercaptoacetate) | 108 | 432 | 29 | — | 100/100 | — |
| Example 2 | Pentaerythritol tetrakis(3-mercaptoacetate) | 122 | 488 | 26 | — | 100/100 | — |
| Example 3 | Dipentaerythritol hexakis(3-mercaptopropionate) | 131 | 783 | 24 | — | 100/100 | — |
| Example 4 | Tetrakis-(7-mercapto-2,5-dithiaheptyl)methane | 170 | 681 | 56 | — | 100/100 | 91/100 |
| Example 5 | Compound A | 222 | 1328 | 56 | — | 100/100 | 100/100 |
| Example 6 | Tetrakis-(7-mercapto-2,5-dithiaheptyl)methane | 170 | 681 | 56 | Yes | 100/100 | 93/100 |
| Example 7 | Tetrakis-(7-mercapto-2,5-dithiaheptyl)methane and compound A | — | — | — | — | 100/100 | 97/100 |
| Example 8 | Tetrakis-(7-mercapto-2,5-dithiaheptyl)methane and compound A | — | — | — | — | 100/100 | 91/100 |
| Example 9 | Tetrakis-(7-mercapto-2,5-dithiaheptyl)methane | 170 | 681 | 56 | Yes | 100/100 | 100/100 |
| Comparative Example 1 | 16-amino-1-hexadecanethiol | 274 | 274 | 12 | — | 0/100 | — |
| Comparative Example 2 | 1,10-Decanedithiol | 103 | 206 | 31 | — | 0/100 | — |
| Comparative Example 3 | Thiocyanuric acid | 59 | 177 | 54 | — | 0/100 | — |
| Comparative Example 4 | Benzenetrithiol | 58 | 174 | 55 | — | 0/100 | — |
| Comparative Example 5 | Trimethylolpropane tris(3-mercaptopropionate) | 133 | 398 | 24 | — | 0/100 | — |
| Comparative Example 6 | (3-Mercaptopropyl)trimethoxysilane | 196 | 196 | 16 | — | 0/100 | — |

As shown in Table 1, in each of the printed circuit boards obtained by the manufacturing method of the present invention, the adhesiveness of the insulating layer was excellent. Particularly, as seen from Examples 4 to 9, it was confirmed that when a thiol compound with a sulfur atom content of 35% by weight or more was used, the insulating layer exhibited excellent adhesiveness even to the core substrate B which had the copper wiring with a smaller surface roughness Rz.

On the other hand, it was confirmed that when a compound not having a thiol group as shown in Comparative Example 1 or a thiol compound having two to three thiol groups as shown in Comparative Examples 2 to 6 was used, the adhesiveness of the insulating layer deteriorated.

Particularly, the embodiment of Comparative Example 3 corresponded to the embodiment of Patent Literature 1, so that it was confirmed that desired effects could not be obtained from the conventional technique.

Example 10

An insulating layer-formed substrate with copper wiring was manufactured according to the same process as in Example 4, except that instead of PFR-800 manufactured by TAIYO INK MFG. CO., LTD., ABF GX-13 manufactured by In Example 10, the core substrate B was used.

Comparative Example 7

Following the procedure in Example 10 but the treatment with the thiol compound, an insulating layer-formed substrate with copper wiring was manufactured and treated, and the tape peeling test was conducted. The results are summarized in Table 2.

TABLE 2

| Example No. | Type of thiol compound | Properties of thiol compound ||| Number of remaining squares/total number of squares |
|---|---|---|---|---|---|
| | | Thiol equivalent (g/eq) | Molecular weight | Sulfur atom content (wt %) | |
| Example 10 | Tetrakis-(7-mercapto-2,5-dithiaheptyl)methane | 170 | 681 | 56 | 100/100 |
| Comparative Example 7 | — | — | — | — | 0/100 |

As shown in Table 2, it was confirmed that the adhesiveness of the insulating layer was excellent even in Example 10 in which the type of the insulating layer was changed.

On the other hand, as seen from Comparative Example 7, when there was no intervening thiol compound layer, the adhesiveness of the insulating layer was poor.

Example 11

Silver was vapor-deposited onto a silicon substrate, thereby forming a core substrate including silver wiring of L/S=1000 μm/100 μm. The thickness of the silver wiring of the obtained substrate with silver wiring was 0.3 μm, and the surface roughness Rz of the silver wiring was 0.02 μm.

Thereafter, the obtained substrate with silver wiring was dipped in a 0.1 mM tetrakis-(7-mercapto-2,5-dithiaheptyl) methane-containing cyclohexanone solution for 20 minutes. The substrate with silver wiring was then washed with cyclohexanone as a washing solvent, further washed with water, and dried at room temperature.

Subsequently, an insulating layer (PFR-800 manufactured by TAIYO INK MFG. CO., LTD.) was laminated on the substrate with silver wiring as treated with the thiol compound, then exposed through a pattern mask (L-shaped pattern), developed, baked, and exposed again, thereby preparing a solder resist (SR) pattern on the substrate with silver wiring (thickness of the insulating layer: 30 μm). The obtained SR pattern-formed substrate with silver wiring was left in a humid environment (temperature of 130° C., humidity of 85% RH, pressure of 1.2 atm) (instrument used: EHS-221 MD manufactured by ESPEC Corp.) for 100 hours, and then the sample was taken out to conduct the tape peeling test. The results are summarized in Table 3.

Comparative Example 8

Following the procedure in Example 11 but the treatment with the thiol compound, an SR pattern-formed substrate with silver wiring was manufactured and left in the humid environment for 100 hours, and then the sample was taken out to conduct the tape peeling test. The results are summarized in Table 3.

TABLE 3

| Example No. | Type of thiol compound | Properties of thiol compound ||| Number of remaining squares/total number of squares |
|---|---|---|---|---|---|
| | | Thiol equivalent (g/eq) | Molecular weight | Sulfur atom content (wt %) | |
| Example 11 | Tetrakis-(7-mercapto-2,5-dithiaheptyl)methane | 170 | 681 | 56 | 100/100 |
| Comparative Example 8 | — | — | — | — | 0/100 |

As shown in Table 3, it was confirmed that even when silver wiring was used as metal wiring, the adhesiveness of the insulating layer was excellent in the printed circuit board of the present invention.

On the other hand, as seen from Comparative Example 8, when there was no intervening thiol compound layer, the adhesiveness of the insulating was poor.

What is claimed is:

1. A printed circuit board comprising an insulating substrate, a metal wiring disposed on the insulating substrate, and an insulating layer disposed on the metal wiring,
    wherein a layer of a thiol compound HS—CH$_2$—*  Formula (1)

is disposed in an interface between the metal wiring and the insulating layer, and
    the thiol compound is a thiol compound represented by Formula (3):

$(HS-CH_2-L^2)_n-Y$  Formula (3)

wherein in Formula (3), $L^2$ represents a divalent aliphatic hydrocarbon group containing —S—, Y represents an n-valent aliphatic hydrocarbon group which may contain a sulfur atom or an oxygen atom, and n is 4 to 20.

2. The printed circuit board according to claim 1, wherein the thiol equivalent (g/eq) of the thiol compound is 2,100 or less.

3. The printed circuit board according to claim 1, wherein the molecular weight of the thiol compound is 8,400 g/mol or less.

4. A metal-surface treatment liquid for a printed circuit board that contains a thiol compound Formula (1)

represented by Formula (3):

Formula (3)

wherein in Formula (3), $L^2$ represents a divalent aliphatic hydrocarbon group containing —S—, Y represents an n-valent aliphatic hydrocarbon group which may contain a sulfur atom or an oxygen atom, and n is 4 to 20, and said treatment liquid is used for treating a surface of a metal wiring of the printed circuit board so as to improve adhesiveness between the metal wiring and an insulating layer in the printed circuit board.

5. An IC package substrate, comprising the printed circuit board according to claim 1.

6. The printed circuit board according to claim 2, wherein the molecular weight of the thiol compound is 8,400 g/mol or less.

7. The printed circuit board according to claim 1, wherein Y represents a group represented by Formula (4) or (5):

Formula (4)

Formula (5)

wherein in Formula (5), $L^3$ represents a divalent aliphatic hydrocarbon group containing a sulfur atom or an oxygen atom.

8. The metal-surface treatment liquid for a printed circuit board according to claim 4, wherein Y represents a group represented by Formula (4) or (5):

Formula (4)

Formula (5)

wherein in Formula (5), $L^3$ represents a divalent aliphatic hydrocarbon group containing a sulfur atom or an oxygen atom.

9. The printed circuit board according to claim 1, wherein the content of sulfur atoms in the thiol compound is 35% by weight or more.

10. The metal-surface treatment liquid for a printed circuit board according to claim 4, wherein the content of sulfur atoms in the thiol compound is 35% by weight or more.

* * * * *